United States Patent

Seki et al.

[11] Patent Number: 4,925,347

[45] Date of Patent: May 15, 1990

[54] METHOD OF CHAMFERING PLANAR PLATE

[75] Inventors: Kameharu Seki; Isamu Kubo, both of Saitama, Japan

[73] Assignee: Nippon CMK Corp., Japan

[21] Appl. No.: 293,114

[22] Filed: Jan. 3, 1989

[30] Foreign Application Priority Data

Mar. 23, 1988 [JP] Japan .................. 63-68677

[51] Int. Cl.$^5$ .............................. B23C 3/12
[52] U.S. Cl. ...................... 409/132; 83/869; 409/138; 409/303; 409/195
[58] Field of Search .......... 409/138, 131, 132, 303, 409/193, 195, 198, 207; 29/829, 846; 51/283 E; 83/837, 869; 144/136 R, 150, 368, 371; 156/153, 154, 267, 268, 353

[56] References Cited

U.S. PATENT DOCUMENTS 3,749,625 7/1973 Berg .................. 144/363 X

FOREIGN PATENT DOCUMENTS 1271678 11/1986 U.S.S.R. .................. 409/138

Primary Examiner—Steven C. Bishop
Attorney, Agent, or Firm—Bruce L. Adams; Van C. Wilks

[57] ABSTRACT

A method of chamfering the outer peripheral edges of plate members comprises stacking the plate members in face-to-face vertically aligned relation so that for each two adjacent plate members the upper outer peripheral edge of the lower plate member opposes the lower outer peripheral edge of the upper plate member, detecting the boundary between two adjacent plate members in the stack, positioning a rotary chamfering tool in response to detection of the boundary, and moving the rotary chamfering tool relative to the outer peripheral edges of the two adjacent plate members to simultaneously chamfer the upper edge of the lower plate member and the lower edge of the upper plate member. The detecting, positioning and chamfering steps are repeated for each two adjacent plate members in the stack to thereby chamfer both the upper and lower edges of the stacked plate members.

16 Claims, 3 Drawing Sheets

METHOD OF CHAMFERING PLANAR PLATE

BACKGROUND OF THE INVENTION

The present invention relates generally to a method of chamfering the edges of planar plate and more particularly to a method of chamfering the edges of printed wiring boards during the manufacturing process thereof.

Conventional planar plates are chamfered one by one. Namely, one plate is positioned correctly on a chamfering table, and a tool chamfers the four edges on one face of the plate; then the plate is reversed or turned upside down and the same process is repeated to chamfer the four edges on the other face of the plate.

Such a conventional process is time consuming as the plate must be positioned accurately on a table, especially when the chamfering tool is guided automatically. Basically, four edges of the plate are first chamfered and then the plate must be reversed so that automatic chamfering is very difficult especially when the plate to be chamfered is thin because positioning of the plate is difficult.

Consequently, the conventional chamfering method is disadvantageous because it is difficult to maintain an accurate plane, and inaccurate positioning and warping and/or damage by the tool may frequently occur. Thus ordinary chamfering is time consuming and results in poor productivity.

SUMMARY OF THE INVENTION

The main object of the present invention is to eliminate or at least mitigate the above mentioned disadvantages and to provide an improved method of chamfering planar plates wherein the chamfering process is performed on a plurality of stacked plates so that positioning error and warp problems are effectively eliminated.

According to the present invention, the chamfering method comprises the steps of stacking a plurality of planar plates and simultaneously chamfering the peripheral edges of adjacent plates in the stack.

According to another embodiment, the chamfering method comprises the steps of stacking a plurality of planar plates, detecting the border between two adjacent plates in the stack, and simultaneously chamfering the peripheral edges of adjacent plates in response to detection of the border.

As the plates are stacked, positioning of the plates need only be done once for the entire stack of plates and no reversing process is necessary. As the border between two stacked plates is detected precisely, tool guiding is accurately performed and the edges to be chamfered are accurately determined. As the tool forms a V-shaped groove, no reverse problem occurs. The method performs accurate chamfering in a very short time period whether or not the plates to be chamfered are thin.

In the conventional chamfering process, about 3–5 seconds per plate is necessary and the chamfer result is not sufficient. Whereas, the present method performs sufficiently accurate chamfering in about ⅓ of the time.

DETAILED DESCRIPTION OF THE PREFERRED EMBODIMENT

Figure 1:
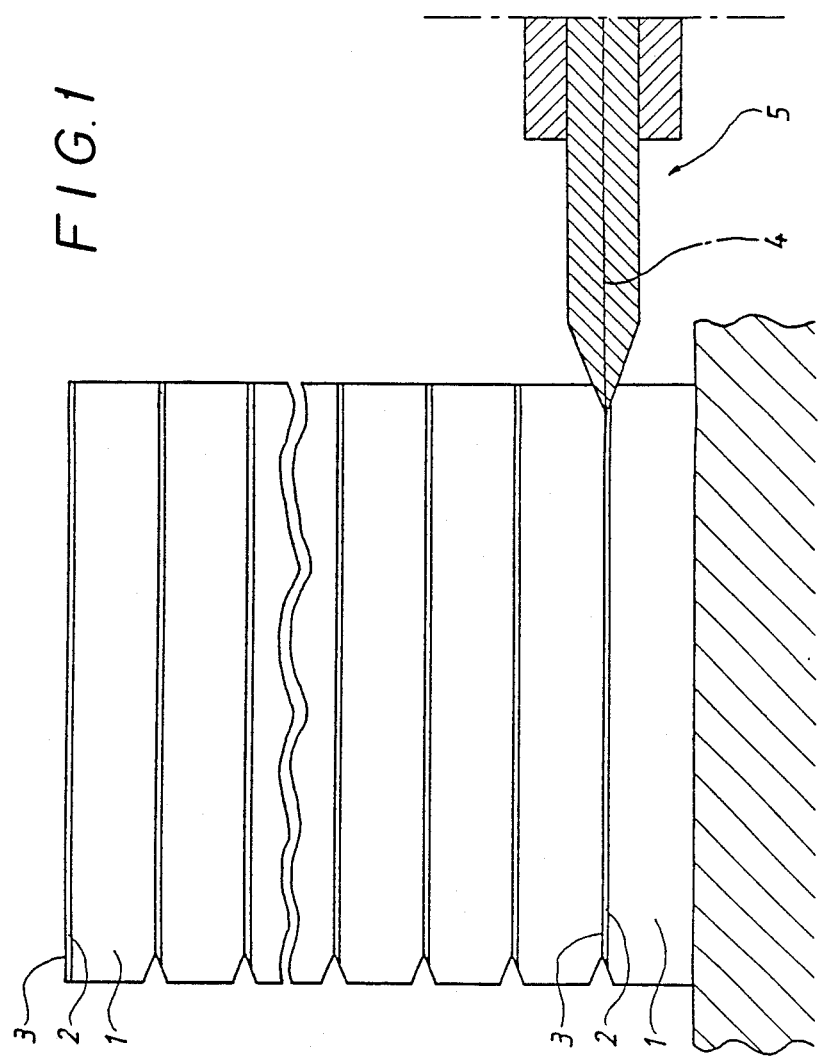
FIG. 1 is a schematic side view, a portion of which is broken away, showing a chamfering apparatus for carrying out one embodiment of chamfering method according to the present invention.

Now, a preferred embodiment of the present invention as applied to chamfering printed wiring boards will be described referring to the drawings.

The chamfering apparatus includes a stacking device, an aligning device, a border detecting device, a chamfering device, a turning device and a discharge device.

The stacking device stacks a plurality, e.g. 10 to 250, of base plates in the form of plate members which are cut by a cutting machine in a suitable container.

At the aligning device, the plates or plate members are pushed from both sides to be parallel to each other and are pushed from the top to maintain the stacked state and the stack is supplied to the chamfering device.

The border detecting device detects the border or boundary between two adjacent plates by means of a CCD camera of a proximate sensor which detects a copper film which covers the printed wiring board at the chamfering station.

The chamfering device utilizes a numerical control device to move a V-shaped tool to align the tool precisely to the detected border and corrects for the copper film thickness of 17–35 μm so that the center of the tool precisely aligns with the center of the border. Then the cutter moves along the border cutting the lower outer peripheral edge of the upper plate and the upper outer peripheral edge of the lower plate by one movement or pass of the cutter.

The cutting process is shown in FIG. 1. Copper film 2 on stacked base plate 1 is detected by a detecting device, not shown, and the center line 4 of a tool 5 is aligned with the border line 3 of the copper film 2. The included angle of the tool may be between 45°–90° and the tool cut is made along the border to the desired depth such as shown in FIG. 1. Cutting is performed sequentially from below. Of course, when both surfaces of the base plate are clad with copper film, the above mentioned correction for the copper thickness is not necessary.

Figure 2A:
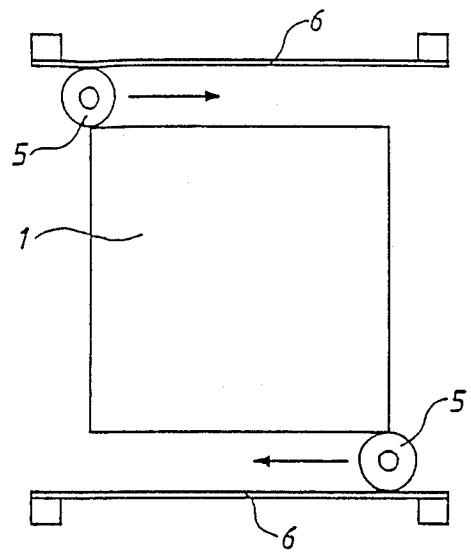
FIGS. 2A, 2B and 2C are plan views showing different arrangements of stacked plates and working tools.
Figure 2B:
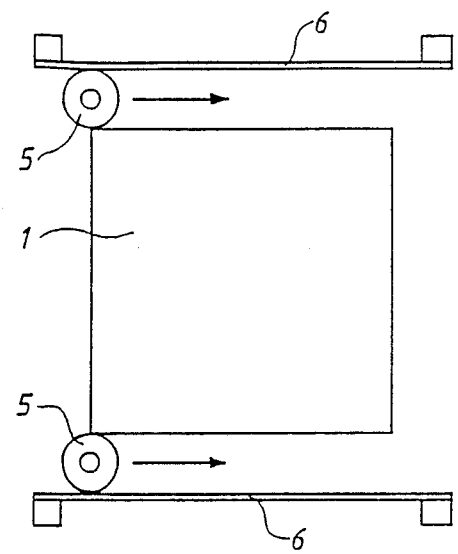
Figure 2C:
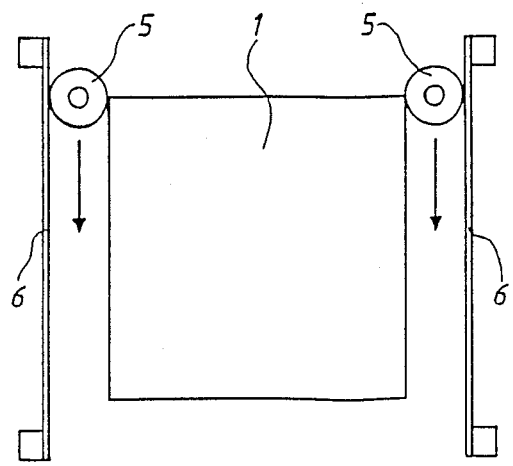
Figure 3:
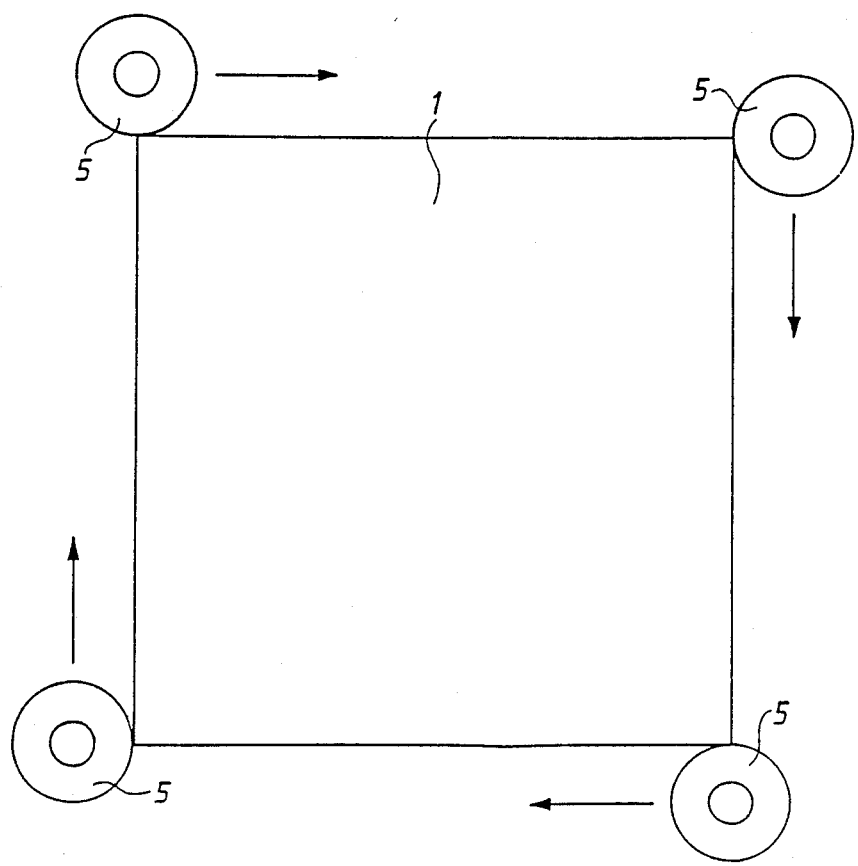
FIG. 3 is a plan view similar to FIG. 2 and showing four tools.

When the chamfer cutting reaches the uppermost plate, the turning device turns the stack of plates 90° so that the tool 5 faces the next side surface of the stack of plates 1. As shown in FIG. 2, when two sets of tools are used, one turning is sufficient to chamfer all four sides of the plates, and when four sets of tools are utilized as shown in FIG. 3, no turning is necessary to complete the chamfer work. In this case, 250 plates can be chamfered in about 5 minutes. A tool holding and moving device 6 is shown in FIG. 2.

After completion of the chamfering of the eight peripheral edges of the plates (four upper and four lower), the base plates are conveyed to a discharge device where the plates are prepared for the next process which is not related to the present invention.

In the drawings, a rotary cutter is used to perform a 45° chamfer. Another desired tool, e.g. an end mill, can be used to perform a 90° chamfer. The angle and depth of the chamfer can be selected as desired.

The present invention has been described with respect to chamfering stacked printed wiring boards as a preferred embodiment. Nonmetallic plates having metal films can be chamfered by the same process. Moreover, other types of plates can be chamfered by utilizing a border detect device having the desired accuracy.

As described, by chamfering the plates in a stacked condition, production efficiency is remarkably improved and the flatness of the plates is maintained sufficiently so that warp or incorrect chamfer is not produced.

We claim:

1. A method of chamfering the edges of plate members, comprising the steps of: providing a plurality of plate members which are alike in size and which have upper and lower outer peripheral edges to be chamfered; stacking the plate members in face-to-face vertically aligned relation so that for each two adjacent plate members the upper outer edge of the lower plate member is opposed to the lower outer edge of the upper plate member; simultaneously chamfering opposed outer edges of two adjacent plate members in the stack; and repeating the simultaneously chamfering step for each two successively adjacent plate members in the stack to thereby chamfer the upper and lower edges of the stacked plate members.

2. A method according to claim 1; wherein the simultaneously chamfering step begins at the two endmost plate members in the stack.

3. A method according to claim 1; wherein the plate members have two pairs of outer sides having upper and lower outer edges, the chamfering steps being carried out to chamfer the upper and lower edges of one of the sides of all the stacked plate members, and then being repeated to chamfer the upper and lower edges of another of the sides of all the stacked plate members.

4. A method according to claim 3; including the step of turning the stack of plate members after chamfering one of the sides of the stacked plate member and before chamfering another of the sides of the stacked plate members.

5. A method according to claim 1; wherein the plate members have two pairs of parallel outer sides having upper and lower outer edges, the chamfering steps being carried out simultaneously on two parallel outer sides of the stacked plate members.

6. A method according to claim 5; wherein the chamfering steps are carried out simultaneously on both pairs of parallel outer sides of the stacked plate members.

7. A method according to claim 1; including the step of detecting the boundary between two adjacent plate members, and carrying out the simultaneously chamfering step in response to detection of the boundary.

8. A method according to claim 7; including repeating the detecting step before each repeated chamfering step.

9. A method according to claim 1; wherein the simultaneously chamfering step comprises displacing a rotating chamfering tool relative to the opposed outer edges of the two adjacent plate members to simultaneously chamfer the opposed outer edges.

10. A method according to claim 9; including simultaneously displacing a plurality of rotating chamfering tools relative to the opposed outer edges of the two adjacent plate members.

11. A method according to claim 9; wherein the chamfering of the opposed outer edges is effected in one pass of the rotating chamfering tool relative to the opposed outer edges.

12. A method according to claim 9; including the steps of detecting the boundary between two adjacent plate members, and positioning the chamfering tool relative to the opposed outer edges of the two adjacent plate members in response to detection of the boundary.

13. A method according to claim 12; including repeating the detecting and positioning steps before each repeated chamfering step.

14. A method according to claim 9; wherein the providing step comprises providing a plurality of plate members comprised of printed wiring boards.

15. A method according to claim 1; wherein the providing step comprises providing a plurality of plate members comprised of printed wiring boards.

16. A method according to claim 1; wherein the providing step comprises providing between 10 to 250 plate members.

* * * * *